United States Patent
Jang

(10) Patent No.: US 10,134,450 B2
(45) Date of Patent: Nov. 20, 2018

(54) SEMICONDUCTOR MEMORY DEVICE HAVING POWER MESH STRUCTURE

(71) Applicant: SK hynix Inc., Gyeonggi-do (KR)

(72) Inventor: Nam-Hea Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/680,929

(22) Filed: Aug. 18, 2017

(65) Prior Publication Data

US 2018/0240504 A1 Aug. 23, 2018

(30) Foreign Application Priority Data

Feb. 17, 2017 (KR) .......................... 10-2017-0021326

(51) Int. Cl.
*G11C 5/06* (2006.01)
*H01L 23/528* (2006.01)
*G11C 5/14* (2006.01)

(52) U.S. Cl.
CPC .......... *G11C 5/063* (2013.01); *H01L 23/5286* (2013.01); *G11C 5/147* (2013.01)

(58) Field of Classification Search
CPC ...... G11C 5/063; G11C 5/147; H01L 23/5286
USPC .......................................................... 365/63
See application file for complete search history.

(56) References Cited

U.S. PATENT DOCUMENTS

| 9,646,974 | B1 * | 5/2017 | Liaw | H01L 27/1104 |
| 2004/0026716 | A1 * | 2/2004 | Ishimatsu | G11C 29/70 |
| | | | | 257/207 |
| 2009/0080257 | A1 * | 3/2009 | Oka | G11C 5/025 |
| | | | | 365/185.13 |

FOREIGN PATENT DOCUMENTS

| JP | 2012-59830 | 3/2012 |
| KR | 100885920 | 2/2009 |
| KR | 1020150037055 | 4/2015 |

* cited by examiner

*Primary Examiner* — Tha-o H Bui
(74) *Attorney, Agent, or Firm* — IP & T Group LLP

(57) ABSTRACT

A semiconductor memory device includes a peripheral circuit including first and second circuit blocks that are respectively disposed in second and third regions adjacent to each other in a first direction with a first region interposed therebetween, first power lines disposed in a first metal layer and connected to the first unit circuit block, second power lines disposed in the first metal layer and connected to the second unit circuit block, and bridge power lines disposed in a second metal layer in the first region and extending in a second direction intersecting with the first direction. The first power lines extend from the second region to the first region and are meshed with the bridge power lines. The second power lines extend from the third region to the first region and are meshed the bridge power lines.

20 Claims, 12 Drawing Sheets

SEMICONDUCTOR MEMORY DEVICE HAVING POWER MESH STRUCTURE

CROSS-REFERENCE TO RELATED APPLICATION

The present application claims priority to Korean Patent Application No. 10-2017-0021326 filed in the Korean Intellectual Property Office on Feb. 17, 2017, which is incorporated herein by reference in its entirety.

BACKGROUND

1. Technical Field

Various embodiments generally relate to a semiconductor memory device, and, more particularly, to a semiconductor memory device having a power mesh structure.

2. Related Art

A semiconductor memory device needs operating voltages such as an external power supply voltage, an internal power supply voltage, a ground voltage and a reference voltage. The operating voltages are transferred through power lines.

SUMMARY

In an embodiment, a semiconductor memory device may include: a peripheral circuit including a first unit circuit block and a second unit circuit block that are respectively disposed in a second region and a third region adjacent to each other in a first direction with a first region interposed therebetween, a first metal layer disposed over the peripheral circuit, and a second metal layer disposed over the first metal layer. First power lines are disposed in the first metal layer and suitable for transferring operating voltages to the first unit circuit block. Second power lines are disposed in the first metal layer and suitable for transferring the operating voltages to the second unit circuit block. Bridge power lines are disposed in the second metal layer in the first region, and extending in a second direction intersecting with the first direction. The first power lines have lengths that extend from the second region to the first region, and the second power lines have lengths that extend from the third region to the first region. The first power lines and the bridge power lines are meshed, and the second power lines and the bridge power lines are meshed.

In an embodiment, a semiconductor memory device may include: a peripheral circuit including a first unit circuit block and a second unit circuit block which are disposed adjacent to each other in a first direction; a memory cell array disposed over the peripheral circuit; first power lines disposed in a first metal layer between the peripheral circuit and the memory cell array, and coupled to the first unit circuit block through first vias; second power lines disposed in the first metal layer, and coupled to the second unit circuit block through second vias; third power lines disposed in a second metal layer between the first metal layer and the memory cell array, crossing the first unit circuit block in a second direction intersecting with the first direction, and meshed with the first power lines; fourth power lines disposed in the second metal layer, crossing the second unit circuit block in the second direction, and meshed with the second power lines; and bridge power lines disposed in the second metal layer, and extending in the second direction in an interval region between the first unit circuit block and the second unit circuit block. The first power lines overlap with the first unit circuit block, extend to the interval region without overlapping with the second unit circuit block, and the second power lines overlap with the second unit circuit block, extend to the interval region without overlapping with the first unit circuit block. The first power lines and the bridge power lines are meshed, and the second power lines and the bridge power lines are meshed.

In an embodiment, a semiconductor memory device may include: a peripheral circuit including a first unit circuit block and a second unit circuit block which are respectively disposed in a second region and a third region adjacent to each other in a first direction with a first region interposed therebetween; a first metal layer disposed over the peripheral circuit; a second metal layer disposed over the first metal layer; a memory cell array disposed over the second metal layer; first power lines disposed in the first metal layer, coupled to the first unit circuit block through first vias, and extending in the first direction; second power lines disposed in the first metal layer, coupled to the second unit circuit block through second vias, and extending in the first direction; third power lines disposed in the second metal layer in the second region, and extending in a second direction intersecting with the first direction; fourth power lines disposed in the second metal layer in the third region, and extending in the second direction; bridge power lines disposed in the second metal layer in the first region, and extending in the second direction. A mesh is formed by coupling the first power lines to the third power lines and the bridge power lines, and coupling the second power lines to the fourth power lines and the bridge power lines, which have the same voltage levels.

DETAILED DESCRIPTION

Hereinafter, a semiconductor memory device having a power mesh structure will be described below with reference to the accompanying drawings through various examples of embodiments.

Figure 1:
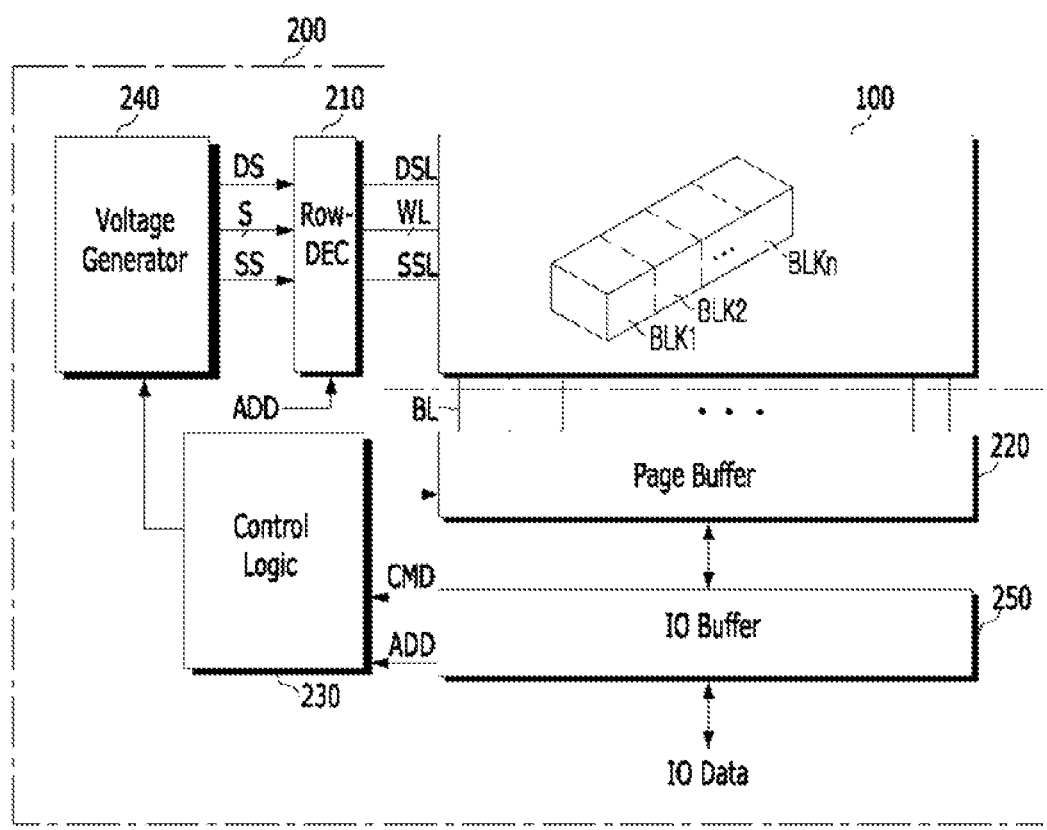
FIG. 1 is a block diagram illustrating a semiconductor memory device, according to an embodiment of the present invention.

FIG. 1 is a block diagram Illustrating a semiconductor memory device, according to an embodiment of the present invention.

Referring to FIG. 1, the semiconductor memory device in accordance with the embodiment may include a memory cell array 100 and a peripheral circuit 200. The peripheral circuit 200 may perform a write operation, a read operation and an erase operation on the memory cell array 100, and may include a plurality of functional circuit blocks. For example, the functional circuit blocks may include a row decoder 210, a page buffer 220, a control logic 230, a voltage generator 240, and an input/output buffer 250.

The memory cell array 100 may be electrically coupled to the row decoder 210 through word lines WL and select lines DSL and SSL. The select lines DSL and SSL may include at least one drain select line DSL and at least one source select line SSL. The memory cell array 100 may be electrically coupled to the page buffer 220 through bit lines BL.

The memory cell array 100 may include a plurality of memory blocks BLK1, BLK2, . . . , BLKn. Each of the plurality of memory blocks BLK1, BLK2, . . . , BLKn may correspond to an erase unit. Each of the memory blocks BLK1, BLK2, . . . , BLKn may include a plurality of cell strings. A cell string may be composed of memory cells which are coupled in series. Memory cells included in one cell string may be selected by the same select transistors.

Figure 2:
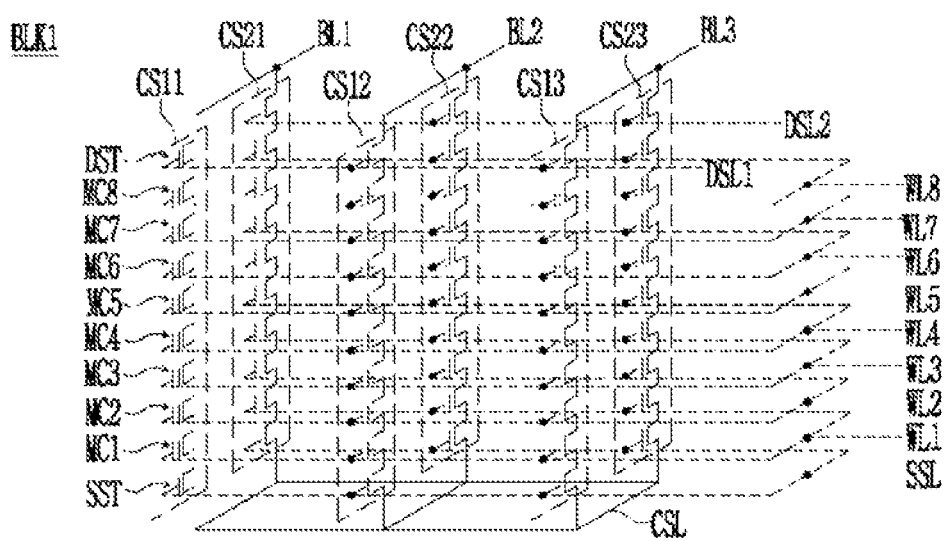
FIG. 2 is an equivalent circuit diagram illustrating one of memory blocks included in a memory cell array shown in FIG. 1.

FIG. 2 is a circuit diagram Illustrating any one memory block BLK1 among the memory blocks BLK1 to BLKn included in the memory cell array 100 of FIG. 1.

Since the memory blocks BLK1 to BLKn are configured in the same manner as one another, descriptions will be made for only a first memory block BLK1.

Referring to FIG. 2, the first memory block BLK1 may include a plurality of cell strings CS11, CS21, CS12, CS22, CS13 and CS23 which extend in a height direction and are arranged in a word line direction and a bit line direction.

The cell strings CS11, CS21, CS12, CS22, CS13 and CS23 may be respectively coupled between bit lines BL1, BL2 and BL3 associated therewith and a common source line CSL, and may be configured in the same manner as one another. Each of the cell strings CS11, CS21, CS12, CS22, CS13 and CS23 may include a source select transistor SST which is coupled to the common source line CSL, a drain select transistor DST which is coupled to a bit line BL, and a plurality of memory cells MC1 to MC8 which are coupled between the source select transistor SST and the drain select transistor DST. The gate of the source select transistor SST may be coupled to a source select line SSL. The gate of the drain select transistor DST may be coupled to a corresponding drain select line DSL1 or DSL2. The gates of the memory cells MC1 to MC8 may be coupled to corresponding word lines WL1 to WL8, respectively.

A set of memory cells which are coupled to the same word line and are programmed together is referred to as a page. The first memory block BLK1 may be configured by a plurality of pages. Also, a plurality of pages may be coupled to each word line. In the embodiment illustrated in FIG. 2, each word line is coupled in common to two pages at the same height.

Referring again to FIG. 1, the row decoder 210 may select any one among the memory blocks BLK1 to BLKn of the memory cell array 100 in response to an address ADD transferred from the input/output buffer 250. The row decoder 210 may select any one among the word lines WL of the selected memory block in response to the address ADD. The row decoder 210 may transfer operating voltages from the voltage generator 240, to the respective word line WL and the select lines DSL and SSL of the selected memory block.

The page buffer 220 operates as a write driver or a sense amplifier depending on an operation mode. In a program operation, the page buffer 220 may transfer a voltage corresponding to data to be programmed, to a bit line BL of the memory cell array 100. In a read operation, the page buffer 220 may sense data stored in a selected memory cell, through a bit line BL, and transfer the sensed data to the input/output buffer 250. In an erase operation, the page buffer 220 may float bit lines BL of the memory cell array 100.

The control logic 230 may control the page buffer 220 and the voltage generator 240 to access selected memory cells, in response to a command CMD transferred from the input/output buffer 250.

The voltage generator 240 may generate various kinds of operating voltages according to control of the control logic 230. The operating voltages may include word line voltages S to be supplied to the respective word line WL and voltages to be supplied to a bulk, for example, a well region, in which memory cells are formed. The word line voltages S supplied to the respective word lines WL may include a program voltage (Vpgm), a pass voltage (Vpass), and select and unselect read voltages (Vrd and Vread). The voltage generator 240 may generate select signals DS and SS which are provided to the select lines DSL and SSL in the read operation and the program operation. The select signal DS is a control signal for selecting a cell string, and the select signal SS is a control signal for selecting a ground.

In the program operation, the input/output buffer 250 may transfer the write data inputted from an exterior, to the page buffer 220. In the read operation, the input/output buffer 250 may output the data provided from the page buffer 220, to the exterior. The input/output buffer 250 may transfer the address ADD or the command CMD to the row decoder 210 or the control logic 230.

Figure 3:
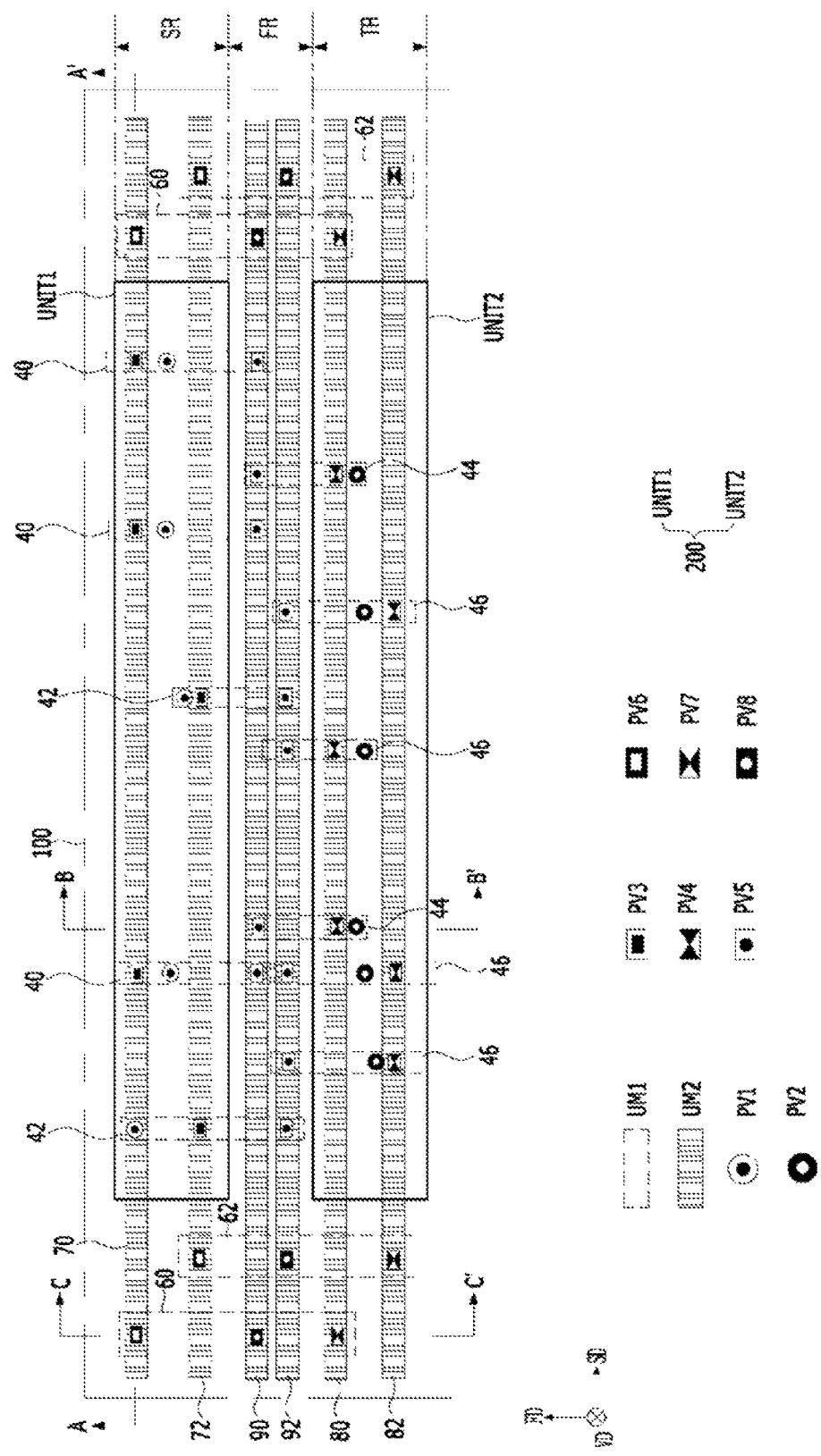
FIG. 3 is a layout diagram illustrating a power line structure of a semiconductor memory device, according to an embodiment of the present invention.
Figure 4:
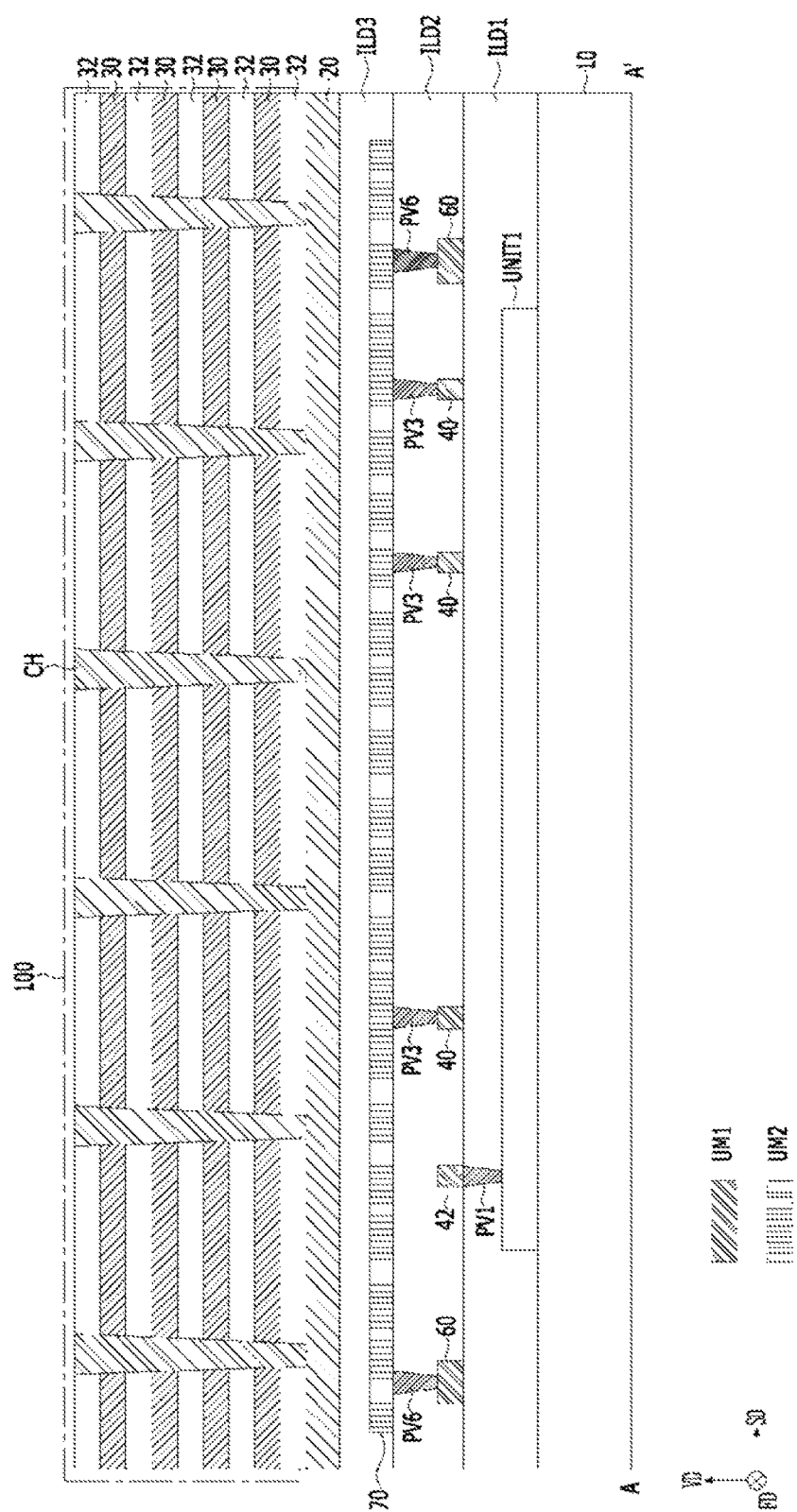
FIG. 4 is a cross-sectional view taken along the line A-A' of FIG. 3.
Figure 5:
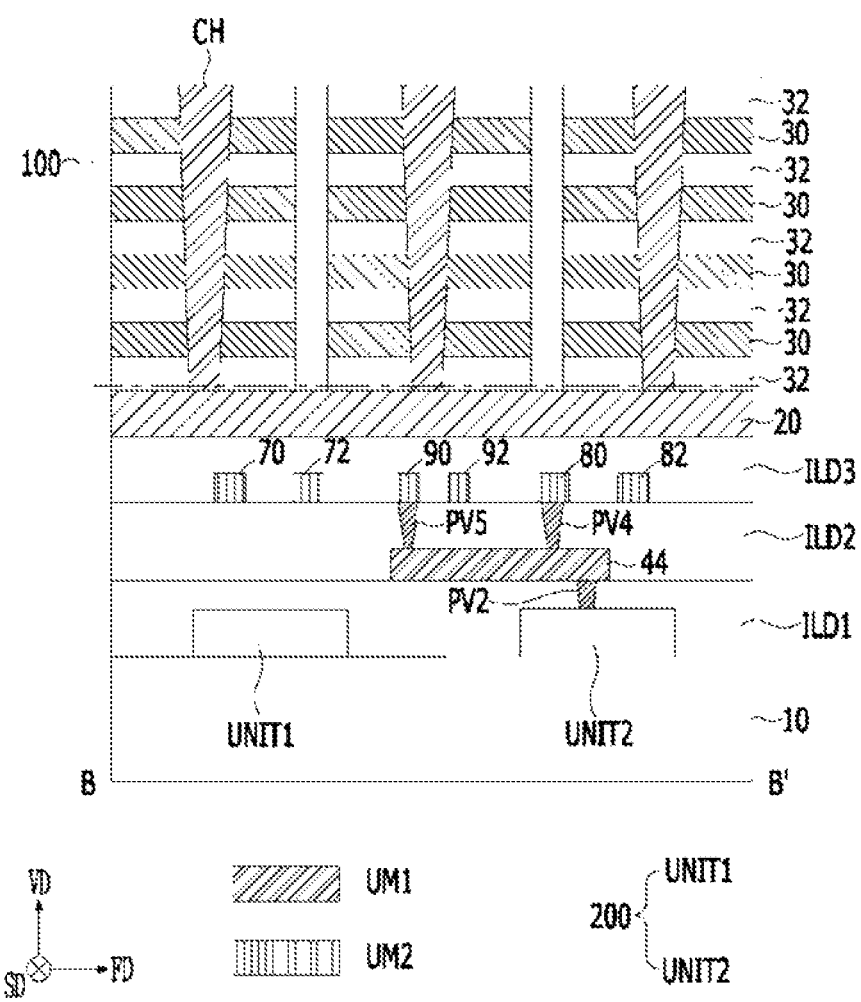
FIG. 5 is a cross-sectional view taken along the line B-B' of FIG. 3.
Figure 6:
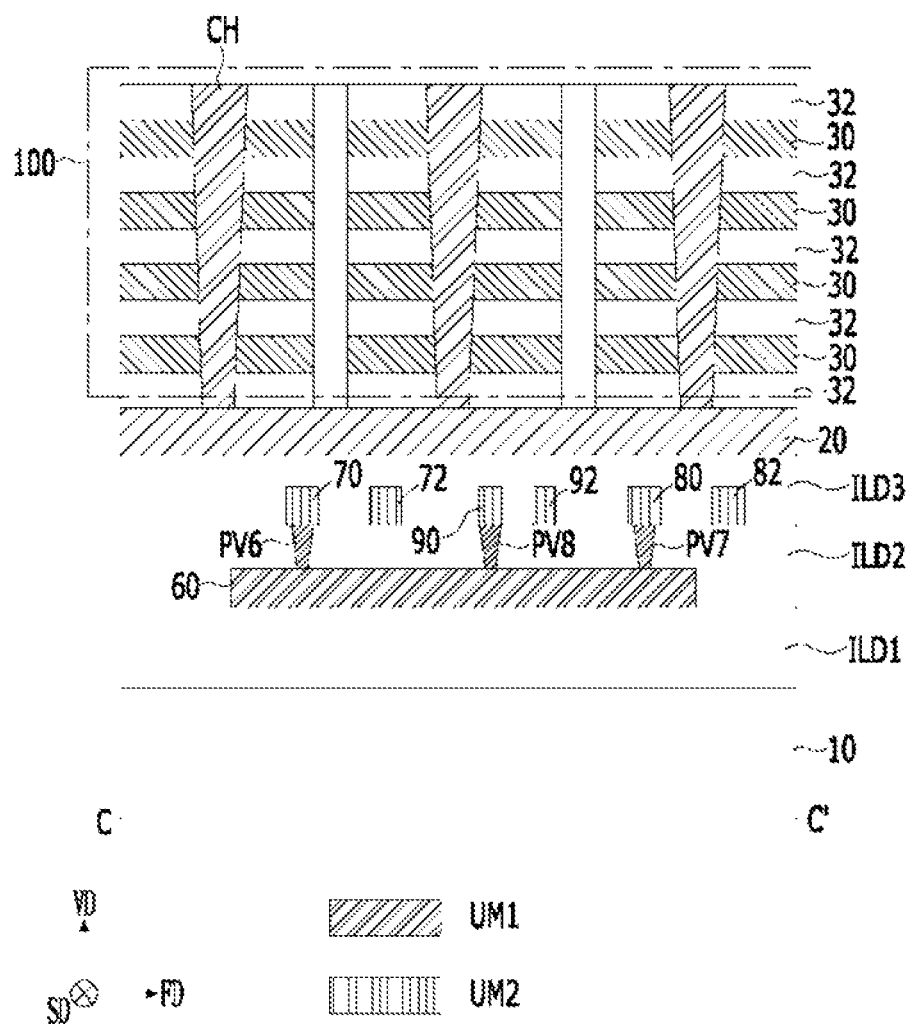
FIG. 6 is a cross-sectional view taken along the line C-C' of FIG. 3.
Figure 7:
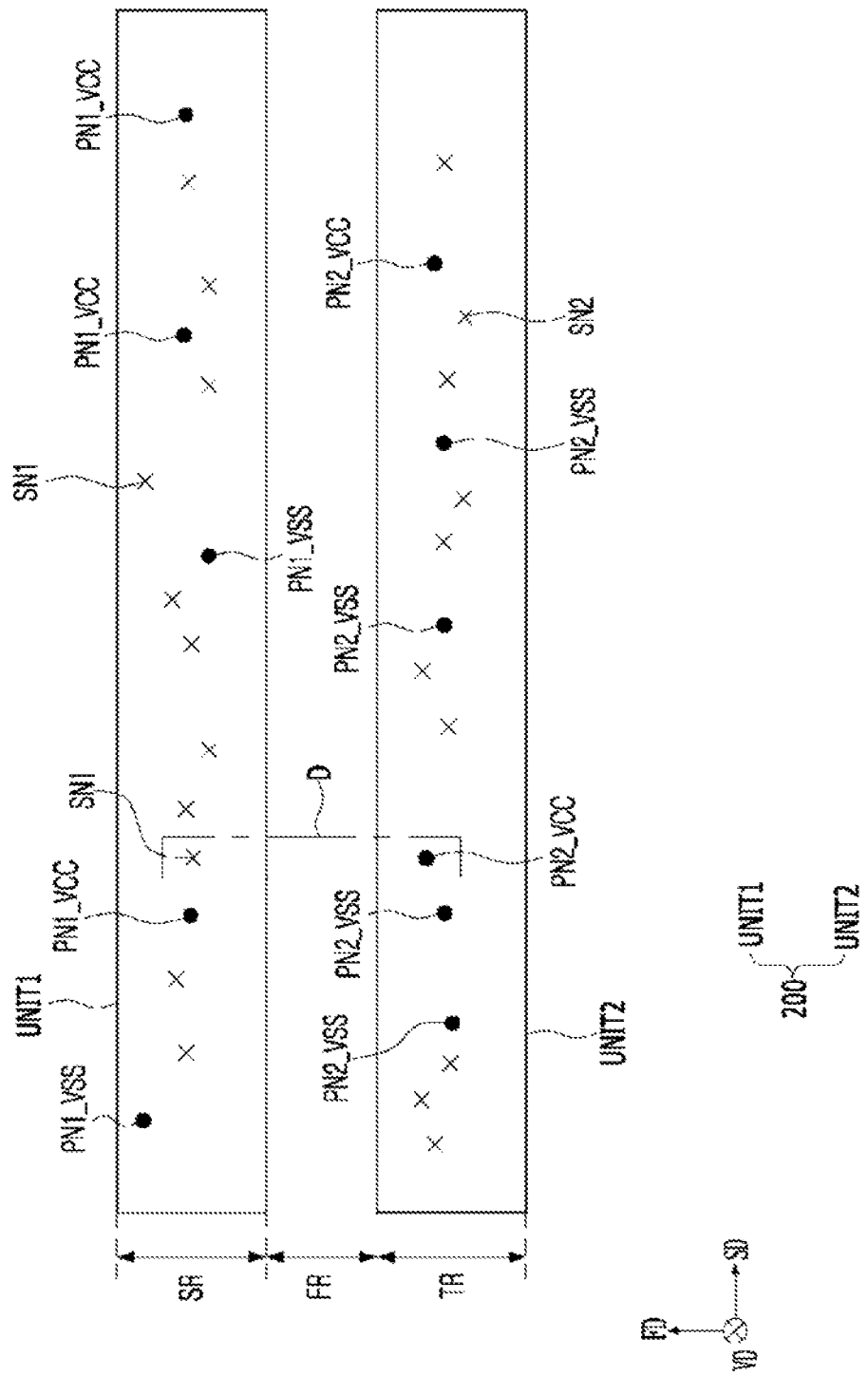
FIG. 7 is a layout diagram illustrating power nodes and signal nodes of a peripheral circuit.
Figure 8:
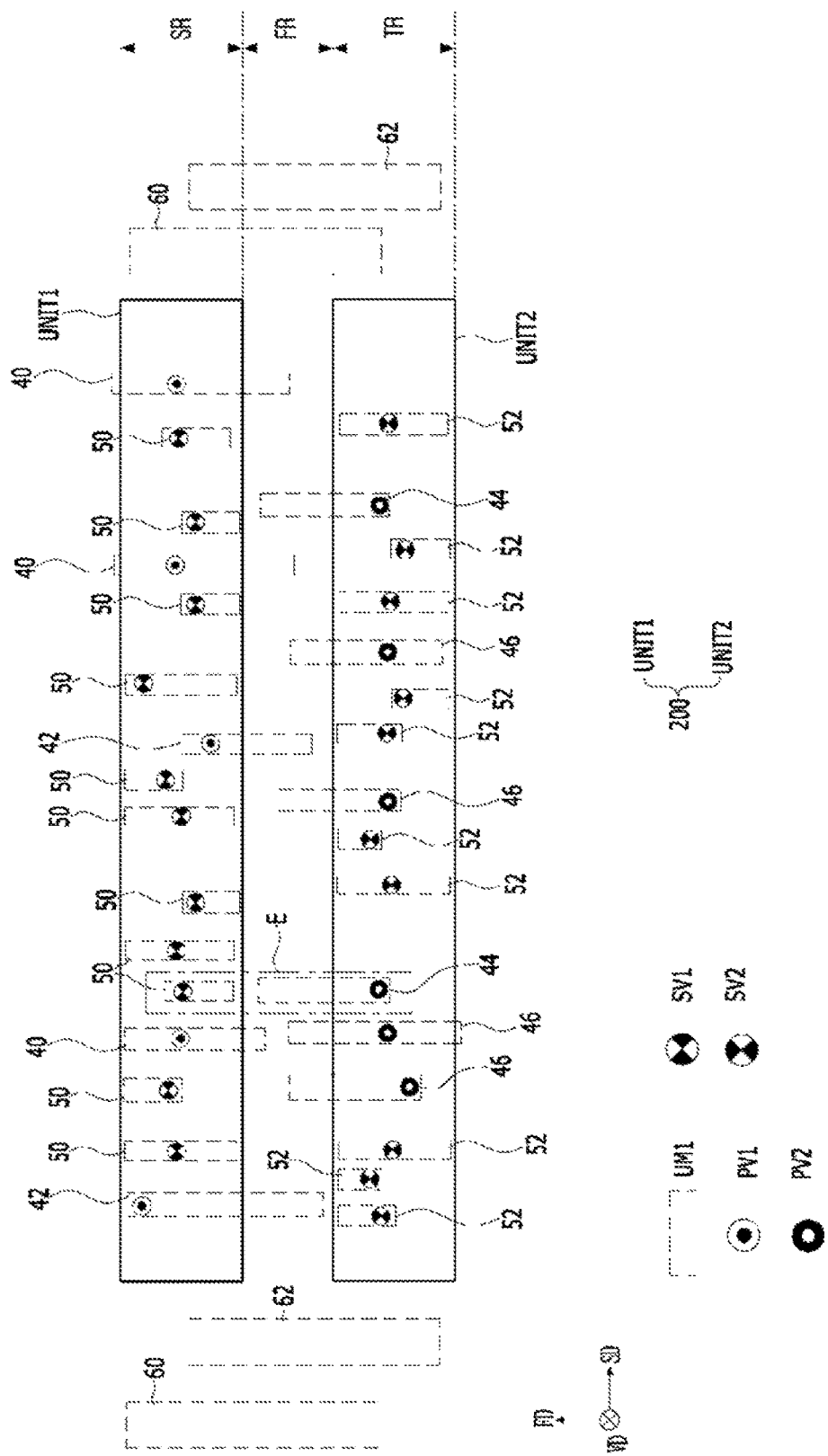
FIG. 8 is a layout diagram Illustrating power lines and signal lines, which are formed in a first metal layer, and vias which couple the peripheral circuit with the power lines and the signal lines formed in the first metal layer.

FIG. 3 is a layout diagram illustrating a power line structure of a semiconductor memory device, according to an embodiment of the present invention, FIG. 4 is a cross-sectional view taken along the line A-A' of FIG. 3, FIG. 5 is a cross-sectional view taken along the line B-B' of FIG. 3, FIG. 6 is a cross-sectional view taken along the line C-C' of FIG. 3, FIG. 7 is a layout diagram illustrating power nodes PN1_VCC, PN1_VSS, PN2_VCC and PN2_VSS and signal nodes SN1 and SN2 of a peripheral circuit, and FIG. 8 is a layout diagram Illustrating power lines 40, 42, 44 and 46 and signal lines 50 and 52, which are formed in a first metal layer UM1, and vias PV1, PV2, SV1 and SV2 which couple the peripheral circuit with the power lines 40, 42, 44 and 46 and the signal lines 50 and 52 formed in the first metal layer UM1.

For the sake of simplification in illustration, in FIGS. 3 to 6, illustration of the signal lines 50 and 52 and the vias SV1 and SV2 which couple the peripheral circuit 200 to the signal lines 50 and 52 is omitted.

Referring to FIGS. 3 to 6, the semiconductor memory device in accordance with the embodiment may have a peri under cell (PUC) structure in which the peripheral circuit 200 is disposed under the memory cell array 100. At least a portion of the peripheral circuit 200 and at least a portion of the memory cell array 100 may overlap up and down.

For the sake of convenience in explanation, the following descriptions will be made for an example in which the entirety of the peripheral circuit 200 and the entirety of the memory cell array 100 overlap up and down, but the present invention is not limited thereto. According to the present embodiment, since the peripheral circuit 200 is disposed to overlap with the memory cell array 100, the area of a substrate 10 may be utilized to a maximum, whereby the size of the semiconductor memory device may be reduced.

The peripheral circuit 200 may be formed on the substrate 10. A semiconductor layer 20 may be disposed over the peripheral circuit 200. The semiconductor layer 20 may be constructed as, for example, a polysilicon layer. In the semiconductor layer 20, the well region (not shown) which is doped with a P-type impurity or an N-type impurity may be formed.

The memory cell array 100 may be disposed on the semiconductor layer 20. The memory cell array 100 may include a plurality of conductive lines 30 and a plurality of interlayer dielectric layers 32 which are stacked alternately on the semiconductor layer 20. Among the conductive lines 30, at least one layer from a lowermost layer may be used as a source select line, at least one layer from an uppermost layer may be used as a drain select line, and conductive lines 30 between the source select line and the drain select line may be used as word lines.

On the semiconductor layer 20, vertical channel layers CH which vertically pass through the conductive lines 30 and the interlayer dielectric layers 32, and are electrically coupled to the semiconductor layer 20, may be formed. The vertical channel layers CH may include a doped polysilicon with an impurity or an undoped polysilicon.

Source select transistors may be formed at regions where the source select line and the vertical channel layers CH Intersect with each other, drain select transistors may be formed at regions where the drain select line and the vertical channel layers CH intersect with each other, and memory cells may be formed at regions where the word lines and the vertical channel layers CH intersect with each other. By such a structure, cell strings may be constructed as the source select transistors, the memory cells and the drain select transistors are coupled in series by the vertical channel layers CH.

A gate dielectric layer (not shown) which surrounds the outer walls of the vertical channel layers CH may be formed between the conductive lines 30 and the vertical channel layers CH. The gate dielectric layer may include a tunnel dielectric layer, a charge storage layer, and a blocking dielectric layer. The tunnel dielectric layer may include a silicon oxide, a hafnium oxide, an aluminum oxide, a zirconium oxide or a tantalum oxide. The charge storage layer may Include a silicon nitride, a boron nitride, a silicon boron nitride or a polysilicon doped with an impurity. The blocking dielectric layer may include a single layer or a stacked layer of a silicon oxide, a silicon nitride, a hafnium oxide, an aluminum oxide, a zirconium oxide and a tantalum oxide.

While not shown, a plurality of bit lines may be disposed over the memory cell array 100. The bit lines may be electrically coupled to the vertical channel layers CH through bit line contacts.

The peripheral circuit 200 may perform a write operation, a read operation and an erase operation on the memory cell array 100, and may be constructed by semiconductor elements such as transistors, resistors and capacitors.

The peripheral circuit 200 may include a plurality of unit circuit blocks. The unit circuit blocks may play different roles such as a row decoder, a page buffer, a control logic, a voltage generator, and an input/output buffer. Each of the unit circuit blocks may be a function unit which performs a specific role. Therefore, the kinds, sizes, and positions of semiconductor elements included in different unit circuit blocks may be different from one another.

The design of the peripheral circuit 200 which is disposed under the memory cell array 100 is continuously changed to reduce the size of the semiconductor memory device and improve the operation characteristics thereof. In addition, to secure the expertise and efficiency of a design work, all the unit circuit blocks included in the peripheral circuit 200 may be not designed by one designer, but different designers may design the unit circuit blocks, respectively. Each of the unit circuit blocks may be used as a unit of design to be conducted by a different designer. Therefore, to facilitate a design work, it is necessary to ensure independence of design between the unit circuit blocks.

Hereinafter, an example in which the peripheral circuit 200 includes two unit circuit blocks will be described. However, it is to be noted that the present embodiment is not limited to the case where the peripheral circuit 200 includes two unit circuit blocks.

The semiconductor memory device in accordance with the embodiment may include a first region FR, a second region SR and a third region TR. The second region SR and the third region TR may be disposed adjacent to each other in a first direction FD with the first region FR interposed therebetween.

The peripheral circuit 200 may include a first unit circuit block UNIT1 which is disposed in the second region SR and a second unit circuit block UNIT2 which is disposed in the third region TR. The first unit circuit block UNIT1 and the second unit circuit block UNIT2 may be disposed adjacent to each other in the first direction FD with the first region FR interposed therebetween. The first region FR may be defined as an interval region which is positioned between the first unit circuit block UNIT1 and the second unit circuit block UNIT2.

Each of the first unit circuit block UNIT1 and the second unit circuit block UNIT2 may include a plurality of semiconductor elements (not shown). The semiconductor elements included in the first unit circuit block UNIT1 and the semiconductor elements included in the second unit circuit block UNIT2 may be driven by operating voltages such as a power supply voltage (VCC) and a ground voltage (VSS). Control signals, address signals and data signals may be inputted to and/or outputted from the semiconductor elements included in the first unit circuit block UNIT1 and the semiconductor elements included in the second unit circuit block UNIT2.

Referring to FIG. 7, the first unit circuit block UNIT1 may include first power nodes PN1_VCC and PN1_VSS for receiving the operating voltages. The first power nodes PN1_VCC and PN1_VSS may include first power nodes PN1_VCC for the power supply voltage and first power nodes PN1_VSS for the ground voltage. The first unit circuit block UNIT1 may include first signal nodes SN1 for receiving and/or outputting the control signals, the address signals, and the data signals.

Similarly to the first unit circuit block UNIT1, the second unit circuit block UNIT2 may include second power nodes PN2_VCC and PN2_VSS for receiving the operating voltages. The second power nodes PN2_VCC and PN2_VSS may include second power nodes PN2_VCC for the power supply voltage and second power nodes PN2_VSS for the ground voltage. The second unit circuit block UNIT2 may include second signal nodes SN2 for receiving and/or outputting the control signals, the address signals, and the data signals.

The first unit circuit block UNIT1 and the second unit circuit block UNIT2 may perform different functions. For example, the first unit circuit block UNIT1 may be a page buffer, and the second unit circuit block UNIT2 may be an input/output buffer. The first unit circuit block UNIT1 and the second unit circuit block UNIT2 may be designed by different designers.

As indicated by the reference symbol D in FIG. 7, the first signal node SN1 of the first unit circuit block UNIT1 and the second power node PN2_VCC of the second unit circuit block UNIT2 may be disposed on the same line. Conversely, while not shown, the first power node PN1_VCC of the first unit circuit block UNIT1 and the second signal node SN2 of the second unit circuit block UNIT2 may be disposed on the same line.

Referring again to FIGS. 3 to 6, the first metal layer UM1 and a second metal layer UM2 may be formed between the peripheral circuit 200 and the memory cell array 100. The second metal layer UM2 may be disposed over the first metal layer UM1.

At least one first interlayer dielectric layer ILD1 may be formed on the substrate 10 to cover the peripheral circuit 200, that is, the first and second unit circuit block UNIT1 and UNIT2. The first metal layer UM1 may be disposed on the first interlayer dielectric layer ILD1.

Referring to FIG. 8, in the first metal layer UM1, there may be disposed first power lines 40 and 42, second power lines 44 and 46, first and second signal lines 50 and 52, and power transfer lines 60 and 62. The first power lines 40 and 42, the second power lines 44 and 46, the first and second signal lines 50 and 52, and the power transfer lines 60 and 62 may extend in the first direction FD.

The first power lines 40 and 42 may include first power lines for the power supply voltage, for transferring the power supply voltage to the first power nodes PN1_VCC (see FIG. 7) of the first unit circuit block UNIT1, and first power lines 42 for the ground voltage, for transferring the ground voltage to the first power nodes PN1_VSS (see FIG. 7) of the first unit circuit block UNIT1.

The first power lines 40 for the power supply voltage may be disposed to overlap respectively with the first power nodes PN1_VCC for the power supply voltage shown in FIG. 7. The first power lines 42 for the ground voltage may be disposed to overlap respectively with the first power nodes PN1_VSS for the ground voltage shown in FIG. 7.

First vias PV1 may be disposed on the first power nodes PN1_VCC and PN1_VSS, respectively, shown in FIG. 7. The first vias PV1 may electrically couple the first power nodes PN1_VCC and PN1_VSS to the first power lines 40 and 42 by vertically passing through the first interlayer dielectric layer ILD1 on the first power nodes PN1_VCC and PN1_VSS, respectively. The first power lines 40 and 42 may be electrically coupled to the first power nodes PN1_VCC and PN1_VSS which have the same voltage levels as the first power lines 40 and 42, through the first vias PV1, respectively.

Similarly to the first power lines 40 and 42, the second power lines 44 and 46 may include second power lines 44 for the power supply voltage, for transferring the power supply voltage to the second power nodes PN2_VCC (see FIG. 7) of the second unit circuit block UNIT2, and second power lines 46 for the ground voltage, for transferring the ground voltage to the second power nodes PN2_VSS (see FIG. 7) of the second unit circuit block UNIT2.

The second power lines 44 for the power supply voltage may be disposed to overlap respectively with the second power nodes PN2_VCC for the power supply voltage shown in FIG. 7. The second power lines 46 for the ground voltage may be disposed to overlap respectively with the second power nodes PN2_VSS for the ground voltage shown in FIG. 7.

Second vias PV2 may be disposed on the second power nodes PN2_VCC and PN2_VSS, respectively, shown in FIG. 7. The second vias PV2 may electrically couple the second power nodes PN2_VCC and PN2_VSS to the second power lines 44 and 46 by vertically passing through the first interlayer dielectric layer ILD1 on the second power nodes PN2_VCC and PN2_VSS, respectively. The second power lines 44 and 46 may be electrically coupled to the second power nodes PN2_VCC and PN2_VSS which have the same voltage levels as the second power lines 44 and 46, through the second vias PV2, respectively.

The first signal lines 50 may be disposed at positions overlapping with the first signal nodes SN1 shown in FIG. 7. Vias SV1 may be disposed on the first signal nodes SN1, respectively. The vias SV1 may electrically couple the first signal nodes SN1 to the first signal lines 50 by vertically passing through the first interlayer dielectric layer ILD1 on the first signal nodes SN1. The first signal lines 50 may be electrically coupled to the first signal nodes SN1 through the vias SV1.

The second signal lines 52 may be disposed at positions overlapping with the second signal nodes SN2 shown in FIG. 7. Vias SV2 may be disposed on the second signal nodes SN2, respectively. The vias SV2 may electrically couple the second signal nodes SN2 to the second signal lines 52 by vertically passing through the first interlayer dielectric layer ILD1 on the second signal nodes SN2. The second signal lines 52 may be electrically coupled to the second signal nodes SN2 through the vias SV2.

When the first signal node SN1 of the first unit circuit block UNIT1 and the second power node PN2_VCC of the second unit circuit block UNIT2 are disposed on the same line, the first signal line 50 and the second power line 44 will be disposed on the same line as indicated by the reference symbol E In FIG. 8. While not shown, when the second signal node SN2 of the second unit circuit block UNIT2 and the first power node PN1_VCC of the first unit circuit block UNIT1 are disposed on the same line, the second signal line 52 and the first power line 40 will be disposed on the same line.

The first power lines 40 and 42 may be formed to overlap partially with the first unit circuit block UNIT1, and have lengths that extend from the second region SR where the first unit circuit block UNIT1 is positioned to the first region FR and do not reach the third region TR. The second power lines 44 and 46 may be formed to overlap partially with the second unit circuit block UNIT2, and have lengths that extend from the third region TR where the second unit circuit block UNIT2 is positioned to the first region FR and do not reach the second region SR.

The power transfer lines 60 and 62 may be disposed to cross the second region SR, the first region FR and the third region TR on both sides of the first and second unit circuit blocks UNIT1 and UNIT2. The power transfer lines 60 and 62 may include power transfer lines 60 for the power supply voltage and power transfer lines 62 for the ground voltage.

Referring again to FIGS. 3 to 6, at least one second interlayer dielectric layer ILD2 may be formed on the first interlayer dielectric layer ILD1 to cover the first metal layer UM1. The second metal layer UM2 may be disposed on the second interlayer dielectric layer ILD2.

In the second metal layer UM2, there may be disposed third power lines 70 and 72, fourth power lines 80 and 82, and bridge power lines 90 and 92.

The third power lines 70 and 72, the fourth power lines 80 and 82, and the bridge power lines 90 and 92 may extend in a second direction SD intersecting with the first direction FD. The second direction SD may be a direction perpendicular to the first direction FD.

The third power lines 70 and 72 may include a third power line 70 for the power supply voltage, for transferring the power supply voltage to the first power lines 40 for the power supply voltage, and a third power line 72 for the ground voltage, for transferring the ground voltage to the first power lines 42 for the ground voltage.

The third power line 70 for the power supply voltage and the third power line 72 for the ground voltage may be disposed to cross the first unit circuit block UNIT1 in the second direction SD in the second region SR. The third power line 70 for the power supply voltage may intersect with the first power lines 40 for the power supply voltage over the first unit circuit block UNIT1. The third power line 72 for the ground voltage may intersect with the first power lines 42 for the ground voltage over the first unit circuit block UNIT1.

Third vias PV3 may be disposed at the intersections between the third power lines 70 and 72 and the first power lines 40 and 42, respectively. The third vias PV3 may electrically couple the third power lines 70 and 72 to the first power lines 40 and 42 which have the same voltage levels, by vertically passing through the second interlayer dielectric layer ILD2. The third power lines 70 and 72 may be electrically coupled to the first power lines 40 and 42 which have the same voltage levels as the third power lines 70 and 72, through the third vias PV3. That is, the first power lines 40 and 42 and the third power lines 70 and 72 may be meshed.

The fourth power lines 80 and 82 may include a fourth power line 80 for the power supply voltage, for transferring the power supply voltage to the second power lines 44 for the power supply voltage, and a fourth power line 82 for the ground voltage, for transferring the ground voltage to the second power lines 46 for the ground voltage.

The fourth power line 80 for the power supply voltage and the fourth power line 82 for the ground voltage may be disposed to cross the second unit circuit block UNIT2 in the second direction SD in the third region TR. The fourth power line 80 for the power supply voltage may intersect with the second power lines 44 for the power supply voltage over the second unit circuit block UNIT2. The fourth power line 82 for the ground voltage may intersect with the second power lines 46 for the ground voltage over the second unit circuit block UNIT2.

Fourth vias PV4 may be disposed at the intersections between the fourth power lines 80 and 82 and the second power lines 44 and 46, respectively. The fourth vias PV4 may electrically couple the second power lines 44 and 46 to the fourth power lines 80 and 82 which have the same voltage levels, by vertically passing through the second interlayer dielectric layer ILD2. The fourth power lines 80 and 82 may be electrically coupled to the second power lines 44 and 46 which have the same voltage levels as the fourth power lines 80 and 82, through the fourth vias PV4. That is, the second power lines 44 and 46 and the fourth power lines 80 and 82 may be meshed.

The bridge power lines 90 and 92 may include a bridge power line 90 for the power supply voltage and a bridge power line 92 for the ground voltage. The bridge power line 90 for the power supply voltage and the bridge power line 92 for the ground voltage may be disposed to extend in the second direction SD in the first region FR.

The bridge power line 90 for the power supply voltage may intersect with the first power lines 40 for the power supply voltage and the second power lines 44 for the power supply voltage, which extend to the first region FR from any one of the second region SR and the third region TR. The bridge power line 92 for the ground voltage may intersect with the first power lines 42 for the ground voltage and the second power lines 46 for the ground voltage, which extend to the first region FR from any one of the second region SR and the third region TR.

Fifth vias PV5 may be disposed at the intersections between the first power lines 40 for the power supply voltage and the bridge power line 90 for the power supply voltage, the intersections between the second power lines 44 for the power supply voltage and the bridge power line 90 for the power supply voltage, the intersections between the first power lines 42 for the ground voltage and the bridge power line 92 for the ground voltage, and the intersections between the second power lines 46 for the ground voltage and the bridge power line 92 for the ground voltage. The fifth vias PV5 may electrically couple the first power lines 40 for the power supply voltage with the bridge power line 90 for the power supply voltage, the second power lines 44 for the power supply voltage with the bridge power line 90 for the power supply voltage, the first power lines 42 for the ground voltage with the bridge power line 92 for the ground voltage, and the second power lines 46 for the ground voltage with the bridge power line 92 for the ground voltage, by vertically passing through the second interlayer dielectric layer ILD2. The bridge power lines 90 and 92 may be electrically coupled to the first power lines 40 and 42 and the second power lines 44 and 46, which have the same voltage levels as the bridge power lines 90 and 92, through the fifth vias PV5. Namely, the first power lines 40 and 42 and the bridge power lines 90 and 92 may be meshed, and the second power lines 44 and 46 and the bridge power lines 90 and 92 may be meshed.

The third power line 70 for the power supply voltage may intersect with the power transfer lines 60 for the power supply voltage on both sides of the first unit circuit block UNIT1. The third power line 72 for the ground voltage may intersect with the power transfer lines 62 for the ground voltage on both sides of the first unit circuit block UNIT1.

Sixth vias PV6 may be disposed at the intersections between the third power line 70 for the power supply voltage and the power transfer lines 60 for the power supply voltage and the Intersections between the third power line 72 for the ground voltage and the power transfer lines 62 for the ground voltage. The sixth vias PV6 may electrically couple the power transfer lines 60 for the power supply voltage with the third power line 70 for the power supply voltage, and the power transfer lines 62 for the ground voltage with the third power line 72 for the ground voltage, by vertically passing through the second interlayer dielectric layer ILD2. The third power lines 70 and 72 may be electrically coupled with the power transfer lines 60 and 62 which have the same voltage levels as the third power lines 70 and 72, through the sixth vias PV6. That is, the third power lines 70 and 72 and the power transfer lines 60 and 62 may be meshed.

The fourth power line 80 for the power supply voltage may intersect with the power transfer lines 60 for the power supply voltage on both sides of the second unit circuit block UNIT2. The fourth power line 82 for the ground voltage may intersect with the power transfer lines 62 for the ground voltage on both sides of the second unit circuit block UNIT2.

Seventh vias PV7 may be disposed at the intersections between the fourth power line 80 for the power supply voltage and the power transfer lines 60 for the power supply voltage and the intersections between the fourth power line 82 for the ground voltage and the power transfer lines 62 for the ground voltage. The seventh vias PV7 may electrically couple the power transfer lines 60 for the power supply voltage with the fourth power line 80 for the power supply voltage, and the power transfer lines 62 for the ground voltage with the fourth power line 82 for the ground voltage, by vertically passing through the second interlayer dielectric layer ILD2. The fourth power lines 80 and 82 may be electrically coupled with the power transfer lines 60 and 62 which have the same voltage levels as the fourth power lines 80 and 82, through the seventh vias PV7. That is, the fourth power lines 80 and 82 and the power transfer lines 60 and 62 may be meshed.

The bridge power lines 90 and 92 may intersect with the power transfer lines 60 and 62, respectively.

Eighth vias PV8 may be disposed at the intersections between the bridge power lines 90 and 92 and the power transfer lines 60 and 62, respectively. The eighth vias PV8 may electrically couple the power transfer lines 60 and 62 to the bridge power lines 90 and 92 which have the same voltage levels, by vertically passing through the second interlayer dielectric layer ILD2. The bridge power lines 90 and 92 may be electrically coupled to the power transfer lines 60 and 62 which have the same voltage levels as the bridge power lines 90 and 92, through the eighth vias PV8. Namely, the bridge power lines 90 and 92 and the power transfer lines 60 and 62 may be meshed.

At least one third interlayer dielectric layer ILD3 may be formed on the second interlayer dielectric layer ILD2 to cover the second metal layer UM2. The semiconductor layer 20 may be disposed on the third interlayer dielectric layer ILD3.

The memory cell array 100 may be disposed on the semiconductor layer 20. The memory cell array 100 may include the conductive lines 30 and the interlayer dielectric layers 32, which are stacked alternately on the semiconductor layer 20 in a third direction VD, and the vertical channel layers CH which vertically pass through the conductive lines 30 and the Interlayer dielectric layers 32 in the third direction VD. Here, the third direction VD may intersect with the first direction FD and the second direction SD. The third direction VD may be a direction perpendicular to the first direction FD and the second direction SD.

Figure 9:
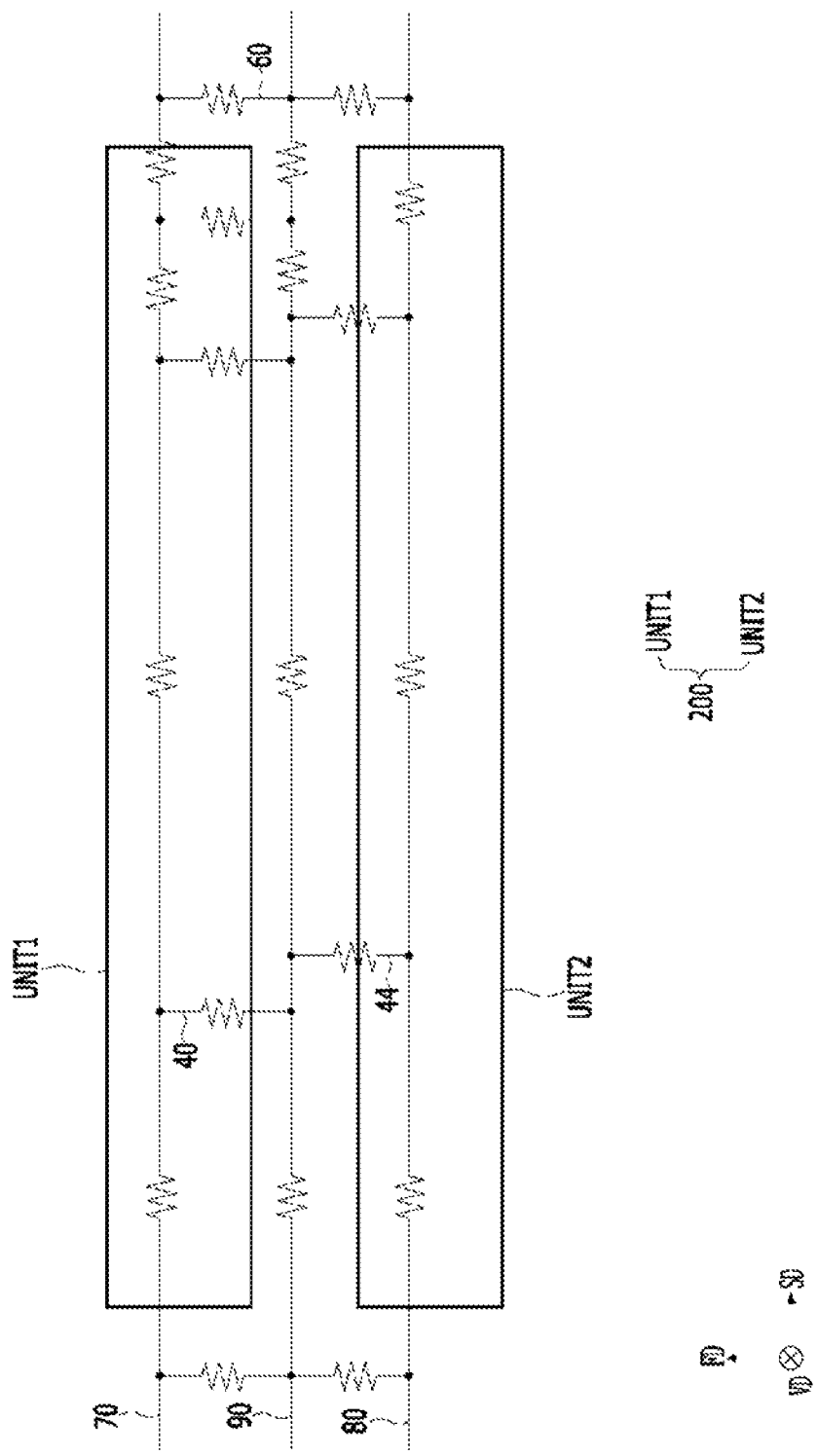
FIG. 9 is a diagram illustrating resistance components representing power lines for a power supply voltage of a semiconductor memory device, according to an embodiment of the present invention.
Figure 10:
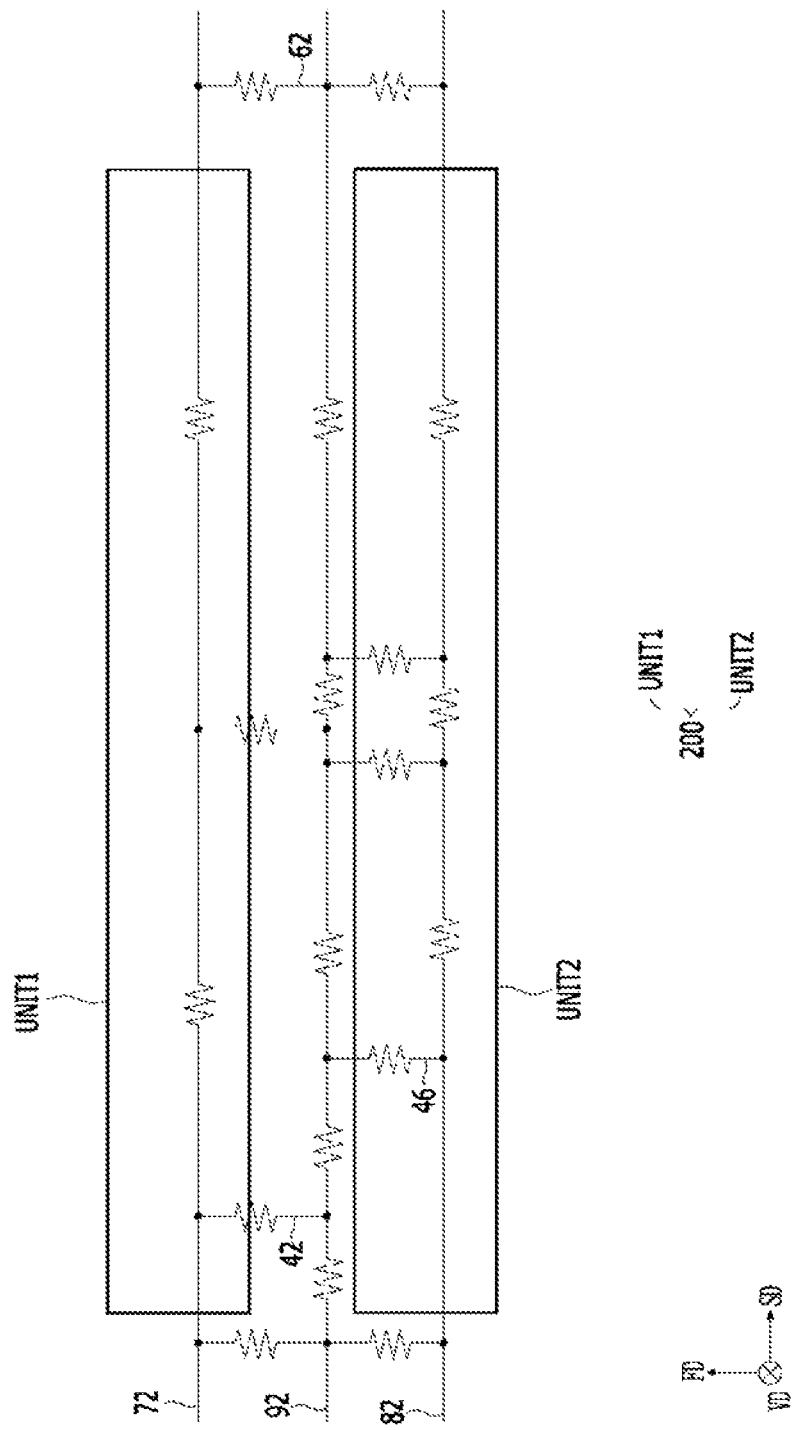
FIG. 10 is a diagram Illustrating resistance components representing power lines for a ground voltage of a semiconductor memory device, according to an embodiment of the present invention.

FIG. 9 is a diagram illustrating resistance components representing power lines for a power supply voltage (VCC) of a semiconductor memory device, according to an embodiment of the present invention, and FIG. 10 is a diagram illustrating resistance components representing power lines for a ground voltage (VSS) of the semiconductor memory device, according to an embodiment of the present invention.

Referring to FIG. 9, the first power lines 40 for the power supply voltage and the third power line 70 for the power supply voltage are coupled with each other as a mesh type over the first unit circuit block UNIT1, and the second power lines 44 for the power supply voltage and the fourth power line 80 for the power supply voltage are coupled with each other as a mesh type over the second unit circuit block UNIT2. Further, between the first unit circuit block UNIT1 and the second unit circuit block UNIT2, the first power lines for the power supply voltage and the bridge power line 90 for the power supply voltage are coupled with each other as a mesh type, and the second power lines 44 for the power supply voltage and the bridge power line 90 for the power supply voltage are coupled with each other as a mesh type.

Referring to FIG. 10, the first power lines 42 for the ground voltage and the third power line 72 for the ground voltage are coupled with each other as a mesh type over the first unit circuit block UNIT1, and the second power lines 46 for the ground voltage and the fourth power line 82 for the ground voltage are coupled with each other as a mesh type over the second unit circuit block UNIT2. Further, between the first unit circuit block UNIT1 and the second unit circuit block UNIT2, the first power lines 42 for the ground voltage and the bridge power line 92 for the ground voltage are coupled with each other as a mesh type, and the second power lines 46 for the ground voltage and the bridge power line 92 for the ground voltage are coupled with each other as a mesh type.

Therefore, as a power mesh of a high density mesh type is provided in the first direction FD and the second direction SD over the entire region of the peripheral circuit 200, operating voltages may be stably provided to the peripheral circuit 200.

Unlike the present embodiment, when the bridge power lines 90 and 92 are not provided, the first power lines 40 and 42 are meshed to only the third power lines 70 and 72 over the first unit circuit block UNIT1, and the second power lines 44 and 46 are meshed to only the fourth power lines 80 and 82 over the second unit circuit block UNIT2. Therefore, between the first unit circuit block UNIT1 and the second unit circuit block UNIT2, a large voltage drop may occur due to insufficiency of a power mesh.

To construct a power mesh between the first unit circuit block UNIT1 and the second unit circuit block UNIT2, the first power lines 40 and 42 may be extended to the third region TR so as to intersect with the fourth power lines 80 and 82 disposed in the third region TR, the second power lines 44 and 46 may be extended to the second region SR so as to intersect with the third power lines 70 and 72 disposed in the second region SR, and vias may be formed at the intersections between the first power lines 40 and 42 and the fourth power lines 80 and 82 and the intersections between the second power lines 44 and 46 and the third power lines 70 and 72.

However, as described above with reference to FIG. 8, the plurality of first signal lines 50 are dispersedly disposed over the first unit circuit block UNIT1 in the second region SR and the plurality of second signal lines 52 are dispersedly disposed over the second unit circuit block UNIT2 in the third region TR. When the first power lines 40 and 42 are extended to the third region TR or the second power lines 44 and 46 are extended to the second region SR, the first power lines 40 and 42 and the second signal lines 52 may be short-circuited or the second power lines 44 and 46 and the first signal lines 50 may be short-circuited.

To address this concern, the second signal lines 52 are not disposed on the same lines as the first power lines 40 and 42 and the first signal lines 50 are not disposed on the same lines as the second power lines 44 and 46. Accordingly, it is possible to prevent the first power lines 40 and 42 and the second signal lines 52 from being short-circuited or the second power lines 44 and 46 and the first signal lines 50 from being short-circuited.

However, the positions of the first and second power lines 40, 42, 44 and 46 and the first and second signal lines 50 and 52 are determined according to the design of the first and second unit circuit blocks UNIT1 and UNIT2. Accordingly, to prevent the second signal lines 52 from being disposed on the same lines as the first power lines 40 and 42, the design of the first unit circuit block UNIT1 has to be considered when designing the second unit circuit block UNIT2, and, to prevent the first signal lines 50 from being disposed on the same lines as the second power lines 44 and 46, the design of the second unit circuit block UNIT2 has to be considered when designing the first unit circuit block UNIT1. This means that independent design between unit circuit blocks becomes impossible. Such dependency of the design between the unit circuit blocks will act as a limiting factor in design.

According to the present embodiment, since the bridge power lines 90 and 92 are disposed in a region, that is, the first region FR, between the first unit circuit block UNIT1 and the second unit circuit block UNIT2, by extending the first power lines 40 and 42 to not the third region TR but only the first region FR and extending the second power lines 44 and 46 to not the second region SR but only the first region FR, it is possible to construct a power mesh between the first unit circuit block UNIT1 and the second unit circuit block UNIT2. Therefore, unlike the comparative example described above, it is possible to prevent the first power lines 40 and 42 and the second signal lines 52 from being short-circuited and the second power lines 44 and 46 and the first signal lines 50 from being short-circuited.

Therefore, the second signal lines 52 may be disposed on the same lines as the first power lines 40 and 42, and the first signal lines 50 may be disposed on the same lines as the second power lines 44 and 46. In the above-described comparative example, the design of the first unit circuit block UNIT1 has to be considered when designing the second unit circuit block UNIT2, to prevent the second signal lines 52 from being disposed on the same lines as the first power lines 40 and 42, and the design of the second unit circuit block UNIT2 has to be considered when designing the first unit circuit block UNIT1, to prevent the first signal lines 50 from being disposed on the same lines as the second power lines 44 and 46. On the contrary, in the embodiment of the present invention, it is not necessary to consider the design of the first unit circuit block UNIT1 when designing the second unit circuit block UNIT2 and consider the design of the second unit circuit block UNIT2 when designing the first unit circuit block UNIT1. That is, unit circuit blocks may be designed independently, and the degree of design freedom may be secured sufficiently.

Figure 11:
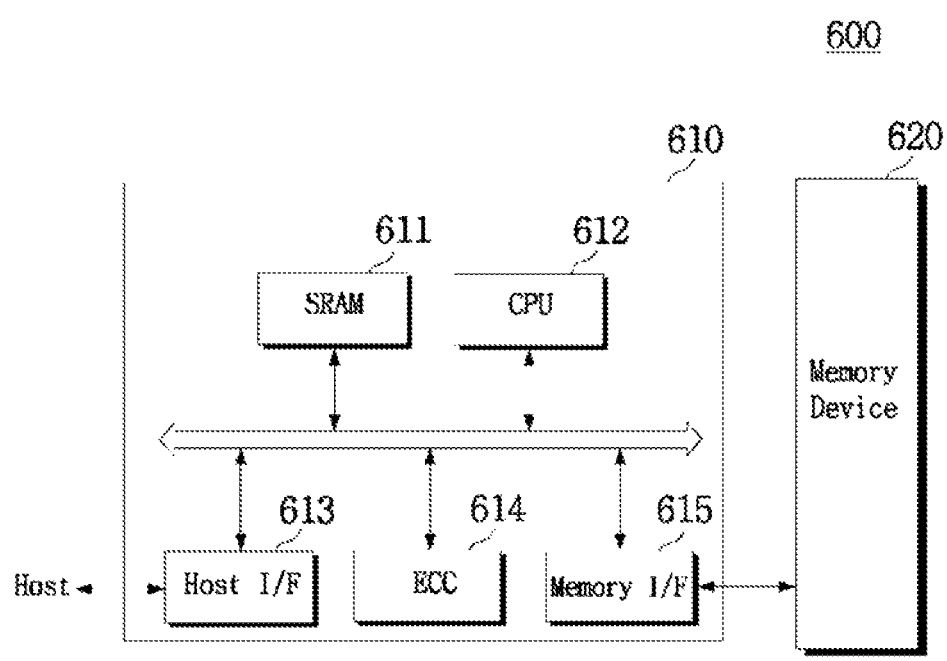
FIG. 11 is a block diagram schematically illustrating a memory system including a semiconductor memory device, according to an embodiment of the present invention.

FIG. 11 is a block diagram schematically illustrating a memory system 600 including a semiconductor memory device 620, according to an embodiment of the present invention.

Referring to FIG. 11, the memory system 600 may include a memory controller 610 and the semiconductor memory device 620. The semiconductor memory device 620 may include a semiconductor memory, according to an embodiment of the invention as described above. The memory controller 610 may control the semiconductor memory device 620. The combination of the semiconductor memory device 620 and the memory controller 610, may be configured as a memory card or a solid state disk (SSD).

The memory controller 610 may include an SRAM 611, a central processing unit (CPU) 612, a host interface 613, an error correction code (ECC) block 614, and a memory interface 615, which are electrically coupled via an internal bus. The SRAM 611 may be used as the working memory of the CPU 612. The host interface 613 may include the data exchange protocol of a host which may be coupled with the memory system 600. All these components are well known in the art and, hence, will not be described in detail.

The ECC block 614 may detect and correct an error included in the data read out from the semiconductor memory device 620.

The memory interface 615 may interface with the semiconductor memory device 620. The CPU 612 may perform general control operations for data exchange of the memory controller 610.

Although not shown, it should become apparent to a person skilled in the art that the memory system 600 may further be provided with a ROM which stores code data for interfacing with the host. The semiconductor memory device 620 may be provided as a multi-chip package constructed by a plurality of flash memory chips.

The memory system 600 may be used as a storage medium of high reliability having a low probability of an error occurring. The aforementioned nonvolatile memory device may be provided in a memory system as a solid state disk (SSD). The memory controller 610 may communicate with an external device for example, the host through one of various interface protocols such as a universal serial bus (USB) protocol, a multimedia card (MMC) protocol, a peripheral component interconnection express (PCI-E) protocol, a serial advanced technology attachment (SATA) protocol, a parallel advanced technology attachment (PATA) protocol, a small computer system interface (SCSI) protocol, an enhanced small disk interface (ESDI) protocol and an integrated device electronics (IDE) protocol and the like.

Figure 12:
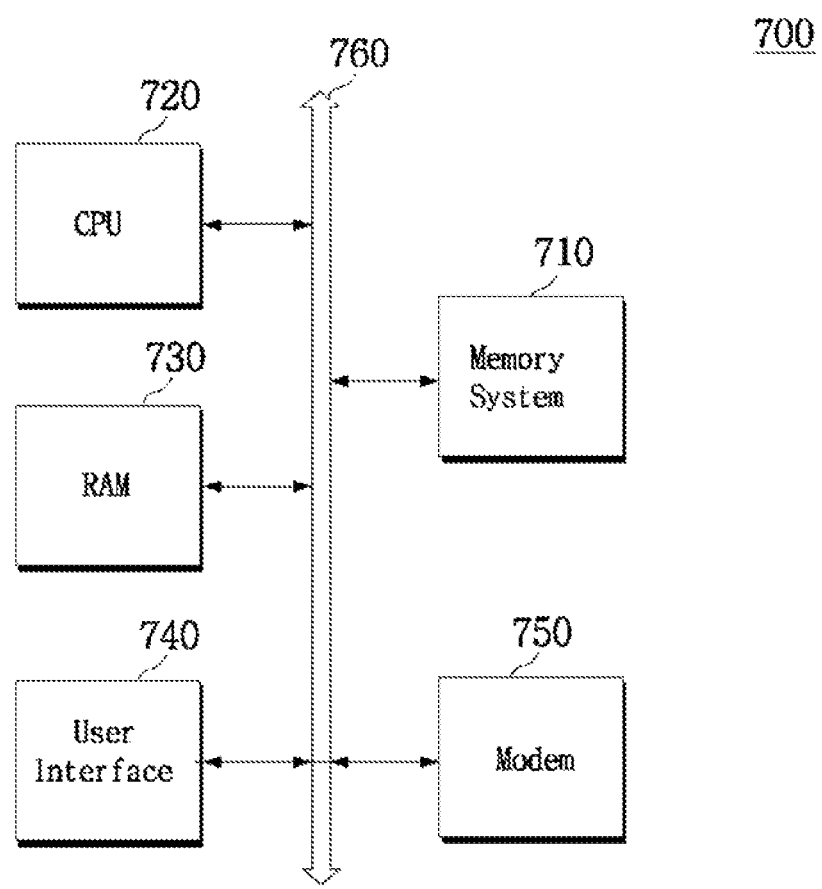
FIG. 12 is a block diagram schematically illustrating a computing system including a semiconductor memory device, according to an embodiment of the present invention.

FIG. 12 is a block diagram schematically illustrating a computing system 700 including a semiconductor memory device, according to an embodiment of the present invention.

Referring to FIG. 12, the computing system 700 according to an embodiment may include a microprocessor (or CPU) 720, a RAM 730, a user interface 740, a modem 750 such as a baseband chipset, and a memory system 710, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CMOS image sensor (CIS), a mobile DRAM, and so on. The memory system 710 may be configured, for example, as a solid state drive/disk (SSD) which uses a nonvolatile memory to store data. Also as an example, the memory system 710 may be provided as a fusion flash memory for example, a NAND or a NOR flash memory.

The above-described embodiments are realized not only by a device and a method, but they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a peripheral circuit including a first unit circuit block and a second unit circuit block that are respectively disposed in a second region and a third region adjacent to each other in a first direction with a first region interposed therebetween;
a first metal layer disposed over the peripheral circuit;
a second metal layer disposed over the first metal layer;
first power lines disposed in the first metal layer and suitable for transferring operating voltages to the first unit circuit block;
second power lines disposed in the first metal layer and suitable for transferring the operating voltages to the second unit circuit block; and
bridge power lines disposed in the second metal layer in the first region, and extending in a second direction intersecting with the first direction,
wherein the first power lines have lengths that extend from the second region to the first region, and the second power lines have lengths that extend from the third region to the first region, and
wherein the first power lines and the bridge power lines are meshed, and the second power lines and the bridge power lines are meshed.

2. The semiconductor memory device according to claim 1, further comprising:
a memory cell array disposed over the second metal layer.

3. The semiconductor memory device according to claim 1, wherein the first unit circuit block and the second unit circuit block perform different functions.

4. The semiconductor memory device according to claim 1, wherein a mesh is formed by coupling the first power lines to the bridge power lines which have the same voltage levels, and coupling the second power lines to the bridge power lines which have the same voltage levels, through vias.

5. The semiconductor memory device according to claim 1, wherein the first power lines and the second power lines extend in the first direction.

6. The semiconductor memory device according to claim 1, further comprising:
third power lines disposed in the second metal layer in the second region, extending in the second direction, and meshed with the first power lines; and
fourth power lines disposed in the second metal layer in the third region, extending in the second direction, and meshed with the second power lines.

7. The semiconductor memory device according to claim 6, further comprising:
power transfer lines meshed with the third power lines, the bridge power lines and the fourth power lines on both sides of the first and second unit circuit blocks.

8. The semiconductor memory device according to claim 7, wherein the power transfer lines are disposed in the first metal layer, and extend in the first direction.

9. The semiconductor memory device according to claim 1,
wherein each of the first and second unit circuit blocks comprises a plurality of power nodes for receiving the operating voltages, and
wherein the first power lines are disposed at positions overlapping with the power nodes of the first unit circuit block, and the second power lines are disposed at positions overlapping with the power nodes of the second unit circuit block.

10. The semiconductor memory device according to claim 9,
wherein the first power lines are electrically coupled to the power nodes of the first unit circuit block through first vias which are disposed vertically on the power nodes of the first unit circuit block, and
wherein the second power lines are electrically coupled to the power nodes of the second unit circuit block through second vias which are disposed vertically on the power nodes of the second unit circuit block.

11. A semiconductor memory device comprising:
a peripheral circuit including a first unit circuit block and a second unit circuit block which are disposed adjacent to each other in a first direction;
a memory cell array disposed over the peripheral circuit;
first power lines disposed in a first metal layer between the peripheral circuit and the memory cell array, and coupled to the first unit circuit block through first vias;
second power lines disposed in the first metal layer, and coupled to the second unit circuit block through second vias;
third power lines disposed in a second metal layer between the first metal layer and the memory cell array, crossing the first unit circuit block in a second direction intersecting with the first direction, and meshed with the first power lines;
fourth power lines disposed in the second metal layer, crossing the second unit circuit block in the second direction, and meshed with the second power lines; and
bridge power lines disposed in the second metal layer, and extending in the second direction in an interval region between the first unit circuit block and the second unit circuit block,
wherein the first power lines overlap with the first unit circuit block, extend to the interval region without overlapping with the second unit circuit block, and the second power lines overlap with the second unit circuit block, extend to the interval region without overlapping with the first unit circuit block, and
wherein the first power lines and the bridge power lines are meshed, and the second power lines and the bridge power lines are meshed.

12. The semiconductor memory device according to claim 11, wherein each of the first power lines and the second power lines intersects with at least one of the bridge power lines.

13. The semiconductor memory device according to claim 11, wherein a mesh is formed by coupling the first power lines to the third power lines which have the same voltage levels, coupling the second power lines to the fourth power lines which have the same voltage levels, coupling the first power lines to the bridge power lines which have the same voltage levels, and coupling the second power lines to the bridge power lines which have the same voltage levels, through vias.

14. The semiconductor memory device according to claim 13, wherein the vias are disposed at intersections between the first power lines and the third power lines which have the same voltage levels, intersections between the second power lines and the fourth power lines which have the same voltage levels, intersections between the first power lines and the bridge power lines which have the same voltage levels, and intersections between the second power lines and the bridge power lines which have the same voltage levels.

15. The semiconductor memory device according to claim 11, further comprising:

power transfer lines extending in the first direction on both sides of the first and second unit circuit blocks, and meshed with the third power lines, the bridge power lines and the fourth power lines.

16. The semiconductor memory device according to claim 15, wherein the power transfer lines are disposed in the first metal layer.

17. A semiconductor memory device comprising:

a peripheral circuit including a first unit circuit block and a second unit circuit block which are respectively disposed in a second region and a third region adjacent to each other in a first direction with a first region interposed therebetween;

a first metal layer disposed over the peripheral circuit;

a second metal layer disposed over the first metal layer;

a memory cell array disposed over the second metal layer;

first power lines disposed in the first metal layer, coupled to the first unit circuit block through first vias, and extending in the first direction;

second power lines disposed in the first metal layer, coupled to the second unit circuit block through second vias, and extending in the first direction;

third power lines disposed in the second metal layer in the second region, and extending in a second direction intersecting with the first direction;

fourth power lines disposed in the second metal layer in the third region, and extending in the second direction;

bridge power lines disposed in the second metal layer in the first region, and extending in the second direction, wherein a mesh is formed by coupling the first power lines to the third power lines and the bridge power lines, and coupling the second power lines to the fourth power lines and the bridge power lines, which have the same voltage levels.

18. The semiconductor memory device according to claim 17, wherein the first power lines have lengths that extend from the second region to the first region and do not reach the third region, and the second power lines have lengths that extend from the third region to the first region and do not reach the second region.

19. The semiconductor memory device according to claim 17, further comprising:

power transfer lines extending in the first direction on both sides of the first and second unit circuit blocks, and meshed with the third power lines, the bridge power lines and the fourth power lines.

20. The semiconductor memory device according to claim 19, wherein the power transfer lines are disposed in the first metal layer.

* * * * *